(12) United States Patent
Detalle et al.

(10) Patent No.: US 10,256,183 B2
(45) Date of Patent: Apr. 9, 2019

(54) MIMCAP STRUCTURE IN A SEMICONDUCTOR DEVICE PACKAGE

(71) Applicant: IMEC, Leuven (BE)

(72) Inventors: Mikael Detalle, Limal (BE); Eric Beyne, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 15/411,891

(22) Filed: Jan. 20, 2017

(65) Prior Publication Data

US 2017/0194246 A1    Jul. 6, 2017

Related U.S. Application Data

(62) Division of application No. 15/014,343, filed on Feb. 3, 2016, now abandoned, which is a division of (Continued)

(30) Foreign Application Priority Data

Nov. 29, 2012  (EP) ..................................... 12194922

(51) Int. Cl.
| | |
|---|---|
| H01L 23/52 | (2006.01) |
| H01L 23/49 | (2006.01) |
| H01L 21/48 | (2006.01) |
| H01L 23/522 | (2006.01) |
| H01L 23/00 | (2006.01) |

(Continued)

(52) U.S. Cl.
CPC ...... *H01L 23/5223* (2013.01); *H01L 21/4857* (2013.01); *H01L 21/768* (2013.01);
(Continued)

(58) Field of Classification Search
CPC ............. H01L 21/4857; H01L 23/5223; H01L 23/49838; H01L 23/49822;
(Continued)

(56) References Cited

U.S. PATENT DOCUMENTS 5,583,359 A * 12/1996 Ng ...................... H01L 23/5223
257/306
5,831,331 A * 11/1998 Lee ....................... H01L 23/645
257/277

(Continued)

OTHER PUBLICATIONS

European Search Report for Application No. EP 12194922 dated Apr. 3, 2013.

(Continued)

*Primary Examiner* — Galina Yushina
(74) *Attorney, Agent, or Firm* — Knobbe, Martens, Olson & Bear LLP

(57) ABSTRACT

The disclosed technology relates generally to a semiconductor device package comprising a metal-insulator-metal capacitor (MIMCAP). In one aspect, the MIMCAP comprises portions of a first and second metallization layers in a stack of metallization layers, e.g., copper metallization layers formed by single damascene processes. The MIMCAP comprises a bottom plate formed in the first metallization layer, a first conductive layer on and in electrical contact with the bottom plate, a dielectric layer on and in contact with the first conductive layer, a second conductive layer on and in contact with the dielectric layer, and a top plate formed in the second metallization layer, on and in electrical contact with the second metal plate. The electrical contacts to the bottom and top plates of the MIMCAP formed in the first and second metallization layer are thereby established without forming separate vias between the plates and the metallization layers. In addition, the first conductive layer of the MIMCAP may extend beyond the surface of the dielectric and the second layer for forming other structures.

15 Claims, 10 Drawing Sheets

Related U.S. Application Data application No. 14/092,762, filed on Nov. 27, 2013, now abandoned.

(51) Int. Cl.

| | | |
|---|---|---|
| *H01L 21/768* | (2006.01) | |
| *H01L 23/48* | (2006.01) | |
| *H01L 23/498* | (2006.01) | |
| *H01L 27/01* | (2006.01) | |
| *H01L 49/02* | (2006.01) | |

(52) U.S. Cl.
CPC ........ *H01L 23/48* (2013.01); *H01L 23/49822* (2013.01); *H01L 23/49827* (2013.01); *H01L 23/49838* (2013.01); *H01L 23/5226* (2013.01); *H01L 24/97* (2013.01); *H01L 28/40* (2013.01); *H01L 28/60* (2013.01); *H01L 27/016* (2013.01); *H01L 28/20* (2013.01); *H01L 2924/0002* (2013.01); *H01L 2924/15788* (2013.01)

(58) Field of Classification Search
CPC ... H01L 23/49827; H01L 28/60; H01L 28/40; H01L 28/56; H01L 28/00
See application file for complete search history.

(56) References Cited

U.S. PATENT DOCUMENTS

| | | | |
|---|---|---|---|
| 6,395,996 B1 | 5/2002 | Tsai et al. | |
| 2003/0211731 A1 | 11/2003 | Kai et al. | |
| 2004/0014313 A1 | 1/2004 | Farooq et al. | |
| 2004/0106266 A1 | 6/2004 | Huang et al. | |
| 2004/0145855 A1 | 7/2004 | Block et al. | |
| 2005/0095781 A1 | 5/2005 | Papa Rao et al. | |
| 2005/0098815 A1 | 5/2005 | Okita et al. | |
| 2005/0112836 A1* | 5/2005 | Kim | H01L 23/5223 438/307 |
| 2005/0136634 A1* | 6/2005 | Savastiouk | H01L 23/13 438/597 |
| 2008/0113455 A1 | 5/2008 | Jain et al. | |
| 2009/0170242 A1* | 7/2009 | Lin | H01L 21/6835 438/107 |
| 2009/0200074 A1* | 8/2009 | Douriet | H01L 23/49827 174/265 |
| 2010/0060381 A1 | 3/2010 | Das et al. | |
| 2011/0062549 A1 | 3/2011 | Lin | |

OTHER PUBLICATIONS

Gurganus et al., "Investigation and Improvement of Early MIM Capacitor Breakdown with a focus on Edge Related Failures", CS MANTECH Conference, May 17-20, 2010, Portland, Oregon, pp. 73-75.

Oliver et al., "Layout Design Rule Effects on Capacitor Reliability", CS MANTECH Conference, Apr. 14-17, 2008, Chicago, Illinois, 4 pages.

Scarpulla et al., "Si3N4 Extrinsic Defects and Capacitor Reliability", IEEE, 2011, pp. 2C.4.1-2C.4.10.

Takemura et al., "SrTiO3 Thin Film Decoupling Capacitors on Si Interposers for 3D System Integration", IEEE, 2009.

\* cited by examiner

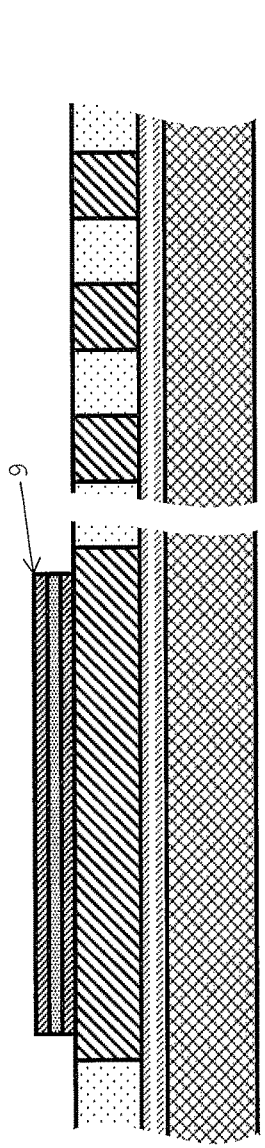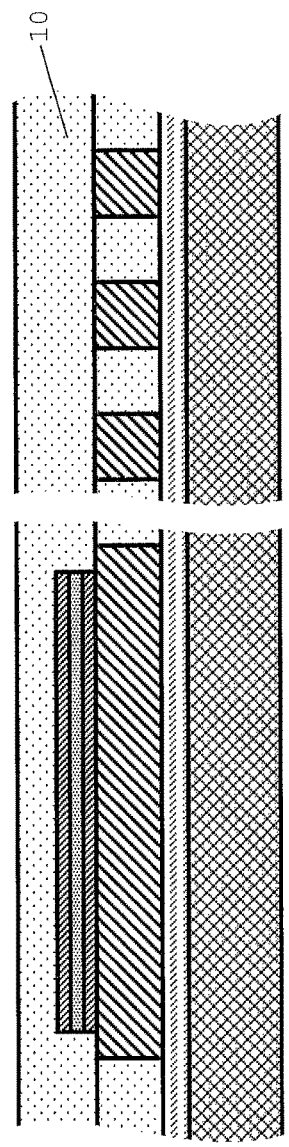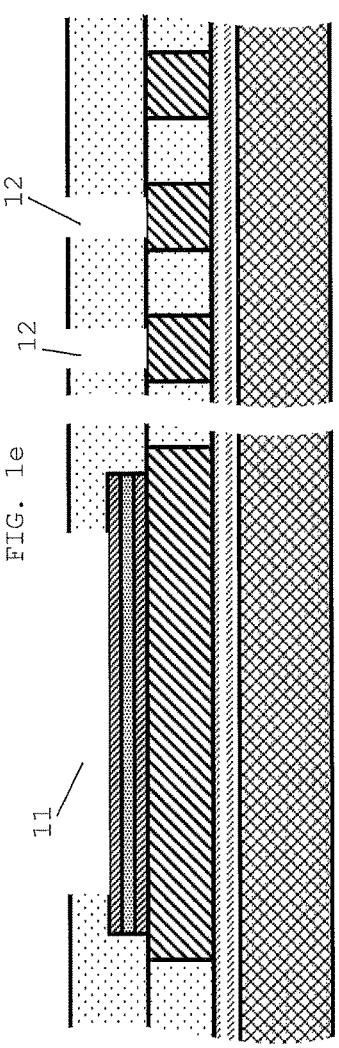

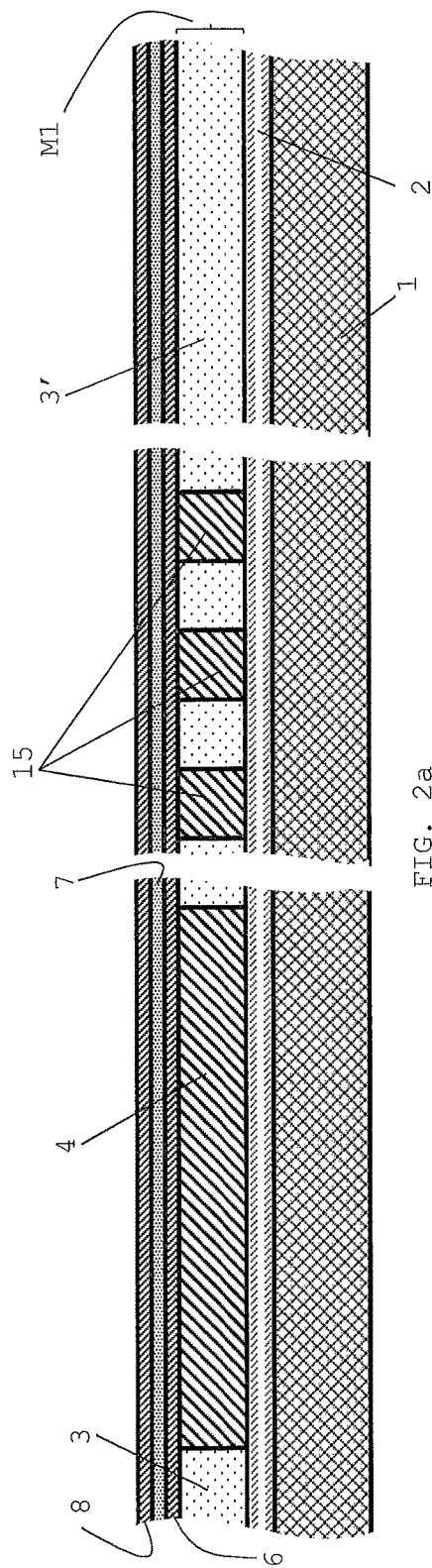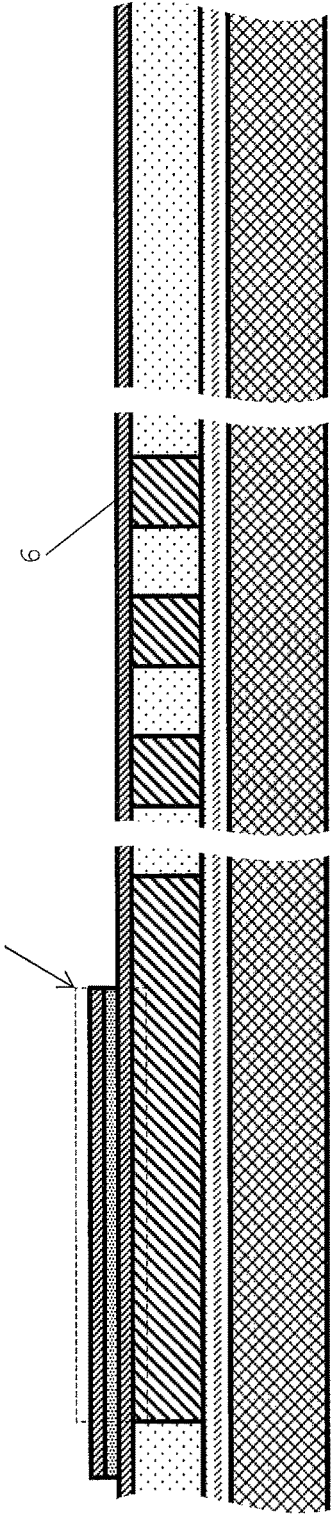
FIG. 2a
FIG. 2b

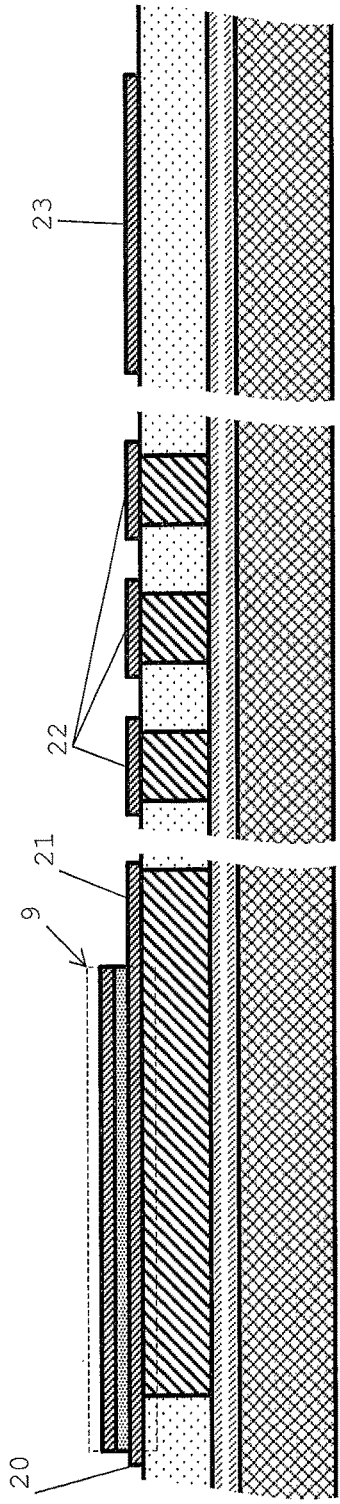
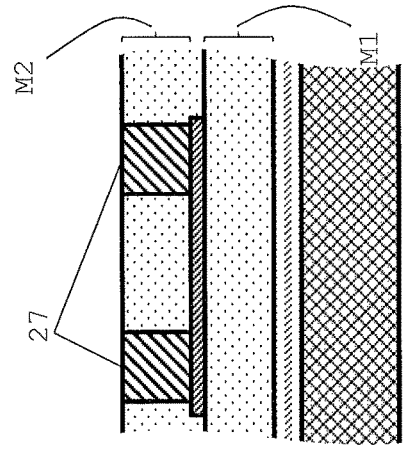
FIG. 2c
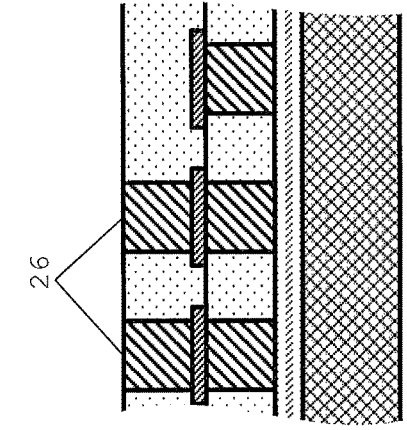
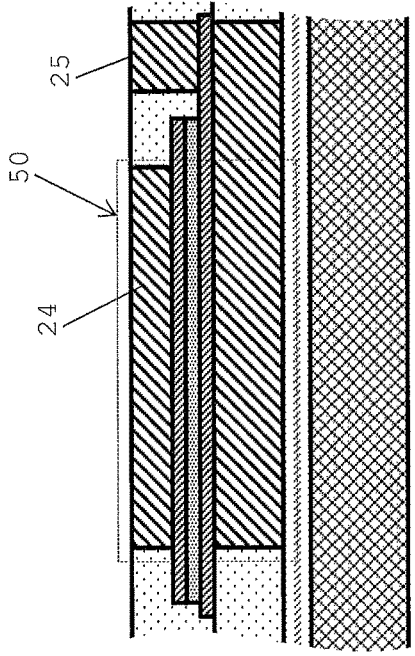
FIG. 2d

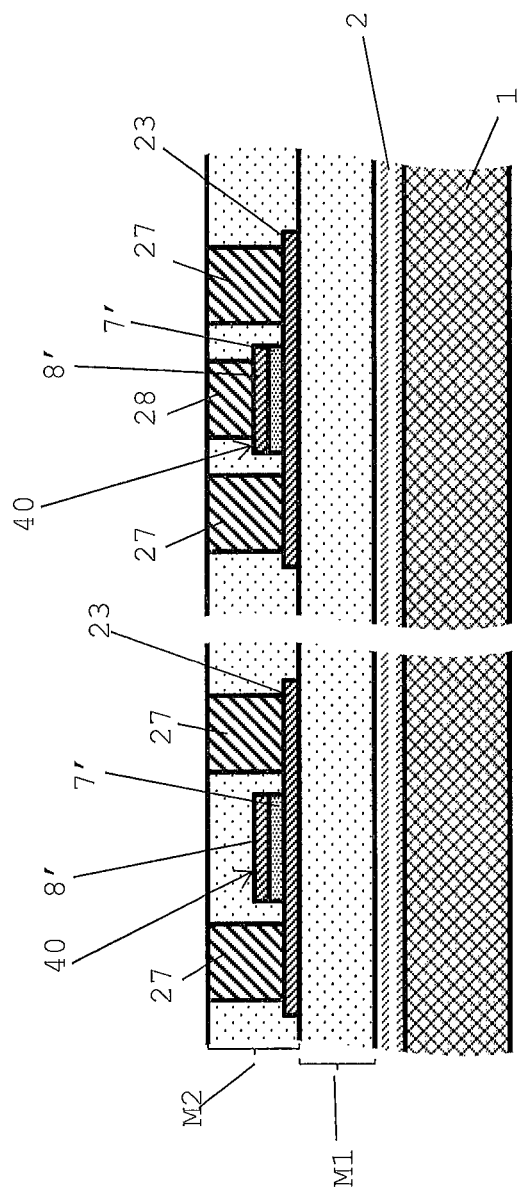

MIMCAP STRUCTURE IN A SEMICONDUCTOR DEVICE PACKAGE

CROSS-REFERENCE TO RELATED APPLICATIONS

This application is a divisional of U.S. application Ser. No. 15/014,343, filed on Feb. 3, 2016, which is a divisional of U.S. application Ser. No. 14/092,762, filed on Nov. 27, 2013, now abandoned, which claims foreign priority to European patent application EP 12194922.6, filed on Nov. 29, 2012. The content of each is incorporated by reference herein in its entirety.

BACKGROUND OF THE INVENTION

Field of the Invention

The disclosed technology relates generally to semiconductor processing, and more particularly to integration of a metal-insulator-metal capacitor in the back-end-of-line (BEOL) processing of a semiconductor package.

Description of the Related Technology

Device downscaling in present day CMOS technology is leading to faster switching speeds of the transistors integrated with a higher density on the semiconductor wafer. However, in the final device, large current spikes may occur due to a large number of 'simultaneous' switching events in the circuit within a short period of time, which can cause considerable current-resistance drop and noise over the power supply network. Voltage fluctuation and power supply noise may impact signal integrity, speed and reliability of the devices. It has been shown that the addition of an on-chip decoupling MIMCAP (Metal-Insulator-Metal capacitor) can reduce this problem and enhance circuit performance. The MIMCAP can compensate voltage fluctuations by delivering charges to the power-supply network. However, its capacitance needs to be large enough to be actually efficient. In addition, low resistance and low inductance is needed to enable the efficient application of MIMCAPs at high frequencies. In present day MIMCAP designs, resistance especially is too high for this purpose because of the connections from at least one of the metallization layers to the top and/or the bottom plate of the MIMCAP. Such connections are established by via etching and filling techniques, typically increasing the resistance of the path from the metallization layer(s) to the MIMCAP.

SUMMARY OF CERTAIN INVENTIVE ASPECTS

The disclosed technology is related to a MIMCAP design that does not suffer from the above-described problem. The technology is particularly related to a MIMCAP structure as disclosed in the appended claims and to a method for producing such a structure. A MIMCAP according to an embodiment comprises portions of first and second metallization layers in a stack of metallization layers, e.g., copper metallization layers, formed by damascene processes. The stack can support one or more semiconductor devices, which are connected through the metallization layers to an external power source. The MIMCAP comprises a bottom plate in the first metallization layer, a first conductive layer on and in electrical contact with the bottom plate, a dielectric layer on and in contact with the first conductive layer, a second conductive layer on and in contact with the dielectric layer, and a top plate in the second metallization layer, on and in electrical contact with the second metal plate. The contacting of the bottom and top plates of the MIMCAP from the first and second metallization layer is thereby established without vias between the plates and the metallization layers. In addition, the first conductive layer of the MIMCAP may extend beyond the surface of the dielectric and the second layer for forming other structures.

In one aspect, a semiconductor device package comprises one or more semiconductor devices electrically coupled to a metallization stack comprising a plurality of interconnected metallization layers. The semiconductor device package additionally includes a metal-insulator-metal capacitor comprising a portion of a lower layer (M1) of the metallization layers and a portion of an upper layer (M2) of the metallization layers, where the lower and upper layers are adjacent metallization layers within the stack. The capacitor includes at least a portion of a bottom plate which forms a part of the lower metallization layer (M1). The capacitor additionally includes at least a portion of a first conductive layer on and in contact with the bottom plate, a dielectric layer on and in contact with the first conductive layer, and a second conductive layer on and in contact with the dielectric layer. The capacitor further includes a top plate which forms a part of the upper metallization layer, the top plate being on and in contact with the second conductive layer.

According to an embodiment, the first and second conductive layer and the dielectric layer in between the layers have the same size in the plane of the layers.

According to another embodiment, the first conductive layer extends beyond the surface of the dielectric layer and the second conductive layer.

In the latter case, the first conductive layer may be patterned in the area outside the area covered by the MIMCAP. The first conductive layer may be patterned to form one or more patterned portions, which serve as contact portions for electrical circuit elements in the lower or upper metallization layer and/or which serve themselves as the electrical circuit elements.

According to an embodiment, a patterned portion of the first conductive layer forms a resistor in the upper metallization layer, and wherein a stack of a dielectric layer portion and a top conductive layer portion is present on top of the resistor, the dielectric layer and top conductive layer portion being of the same material and thickness of the dielectric layer and second conductive layer of the capacitor.

According to an embodiment, the second conductive layer is surrounded in the plane of the layer by a ring structure of the same material and thickness of the second conductive layer.

The first and second metallization layer may be the power supply layer and the ground layer respectively of an interposer substrate carrying one or more integrated circuit devices.

The bottom and/or top plate may be provided with perforations through the complete thickness of the plates, the perforations being filled with a dielectric material.

The invention is equally related to a method for producing a semiconductor package according to the invention, comprising the processes of:
  Producing a first metallization layer by a damascene process, the first metallization layer comprising a bottom plate,
  Depositing a stack of a first conductive layer, a dielectric layer and a second conductive layer on and in contact with the first metallization layer,
  Patterning at least the second layer and the dielectric layer to form a stack of the first conductive layer or a portion thereof, the dielectric layer and the second conductive layer, which covers at least partially the bottom plate, Producing a second metallization layer by a damascene process, the second metallization layer comprising a top plate which is on and in contact with the second conductive layer of the stack.

In the method of the invention, the patterning step may be performed to the effect of forming a stack of the first conductive layer, the dielectric layer and the second conductive layer, the layers being of the same size in the plane of the layers.

According to another embodiment, the patterning step is performed to the effect of forming a stack of the dielectric layer and the second conductive layer on top of the first conductive layer, the first conductive layer remaining intact after the patterning step.

According to an embodiment, the first conductive layer is further patterned in a second patterning step. During the second patterning step, the first conductive layer and the second conductive layer portion of the stack may be patterned simultaneously.

During the second patterning step, the second conductive layer portion of the stack may be patterned to form a ring structure around a central portion of the second conductive layer.

BRIEF DESCRIPTION OF THE DRAWINGS

FIGS. 1a to 1g illustrate a method of fabricating a MIMCAP structure according to one embodiment.

FIGS. 2a to 2e illustrate a method of fabricating a MIMCAP structure according to another embodiment.

FIGS. 5a and 5b illustrate a resistor device that can be fabricated together with a MIMCAP according to one embodiment.

DETAILED DESCRIPTION OF CERTAIN ILLUSTRATIVE EMBODIMENTS

As used herein, a metallization layer refers to a layer or a stack of layers including a dielectric material and a pattern of electrically conductive material embedded in the layer or the stack of layers including the dielectric material. Subsequent metallization layers in the stack are isolated from each other except through vertical connections between the electrically conductive material.

As used herein, a patterning process refers to a fabrication process in which portions of a layer are removed by etching away the portions while the remainder of the layer is protected by an etch mask, leaving a pattern formed by the remaining parts of the layer. The patterning may take place by known photolithography techniques involving a resist layer, or by hard mask techniques, equally known in the art.

Figure 1A:
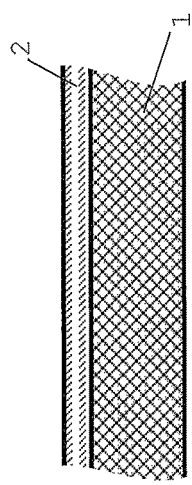
Figure 1B:
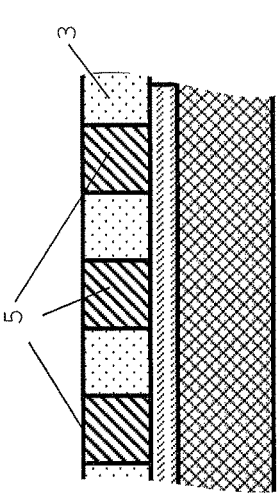
Figure 1C:
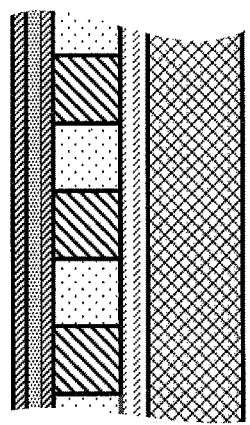
Figure 1G:
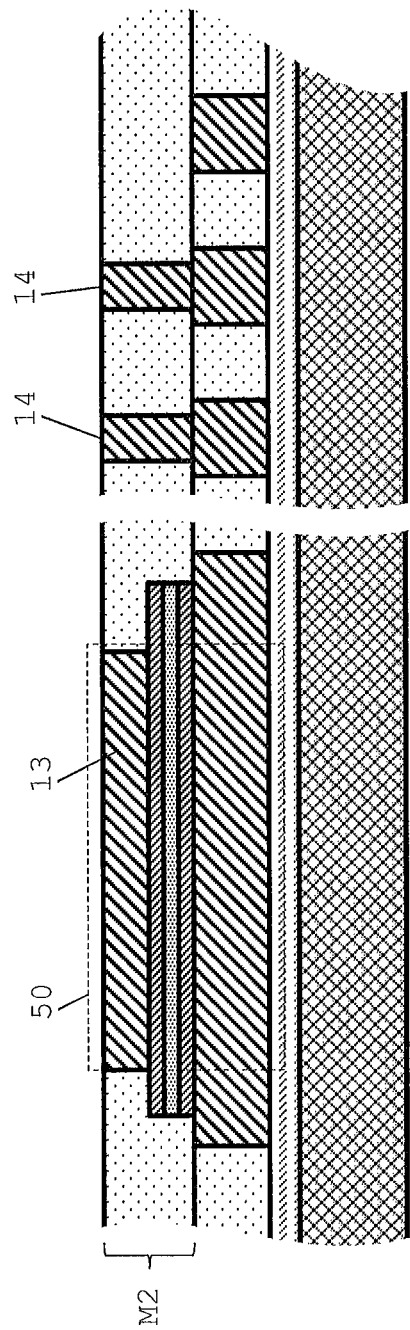

FIGS. 1a-1g illustrate a method of fabricating a MIMCAP according to one embodiment. In the illustrated embodiment, the MIMCAP is formed between two copper metallization layers produced on a substrate. The substrate may for example be an active or passive interposer substrate onto which various integrated circuit chips are to be assembled. FIG. 1a shows a base substrate 1, provided with an isolation layer 2 over the substrate. In some embodiments, the base substrate 1 comprises silicon and the isolation layer 2 comprises a layer formed of, for example, silicon oxide, silicon nitride, silicon carbide or a combination (e.g. a stack) of two or three of these materials. Alternatively, in other embodiments, the substrate may comprise a glass substrate (i.e. instead of the combined Si+isolation layer).

On the substrate 1, a first metallization layer M1 is provided, which can be formed, for example, by a damascene process as known in the art. A first layer 3 of inter-metal dielectric (IMD) is deposited, and patterned by a patterning step as defined above, to form openings and/or trenches, which can then be lined with a barrier layer for preventing Cu-diffusion into the IMD combined with a copper seed deposited by a suitable deposition technique (such as physical or chemical vapour deposition—PVD or CVD), as known in the art. After that, copper is plated (using electrochemical deposition ECD) to fill openings and/or trenches. The copper which has been plated not only in the openings and trenches but also on top of the IMD, is planarized by a CMP (Chemical Mechanical Polishing) process, which leads to the result shown in FIG. 1b. The barrier layer is not shown in this drawing for clarity. In the disclosed method, the first metallization layer M1 thus obtained comprises at least one plate 4 which is to form the bottom plate of the MIMCAP. This may be a rectangular plate for example. The bottom plate 4 is preferably provided with perforations (not shown) filled with dielectric, which serve to maintain flatness of the bottom plate during CMP. The perforations are obtained as non-etched IMD portions during the IMD patterning step, onto which the copper is deposited, the copper filling the spaces between the IMD portions.

By way of an example, three additional copper structures 5 are shown, which can include, for example, conductors running along a pre-defined pattern in the first metallization layer M1. Then a stack of three layers (6, 7, 8) is deposited on the planarized surface (FIG. 1c), for example by PVD deposition processes, including a first electrically conductive layer 6, a dielectric layer 7 and a second electrically conductive layer 8. In the rest of this description and in the claims, these electrically conductive layers 6 and 8 will be referred to as 'conductive layers' for reasons of conciseness. The conductive layers may be formed of metal layers or layers of conductive materials, e.g, TiN or TaN. The stack of layers 6/7/8 is then patterned, to form a MIM-stack 9 (FIG. 1d), which covers at least a portion of the bottom plate 4. This is followed by the deposition of a further IMD layer 10 (FIG. 1e), which is patterned to form at least one opening 11 on top of the MIM-stack, as well as vias 12 towards some of the structures 5 (FIG. 1f). By another damascene process, the openings are filled with copper and planarized, resulting in the second metallization layer M2, comprising the top plate 13 (which can be perforated as described above for the first metallization layer M1, for maintaining flatness), in contact with the second conductive layer 8 of the MIM-stack (FIG. 1g), as well as via connections 14 for connecting the structures 5 with a further metallization layer. The final MIMCAP-structure 50 comprises a portion of the bottom plate 4, the first conductive layer 6, the dielectric layer 7, the second conductive layer 8 and the top plate 13.

In embodiments of the method described herein, no via connections are formed towards the top or bottom plate of the MIMCAP. According to embodiments, the MIMCAP includes the bottom plate 4, the first conductive layer 6 in contact with the bottom plate 4, the dielectric layer 7 in contact with the first conductive layer 6, the second conductive layer 8 in contact with the dielectric layer 7, and the top plate 13 in contact with the second conductive layer, wherein the bottom plate is part of a first metallization layer and the top plate is part of a second metallization layer in a metallization stack coupled between one or more semiconductor devices and an external power source.

According one embodiment, the formation of the MIM-stack 9 takes place by multiple patterning processes, wherein in the first patterning step, the first conductive layer 6 remains intact on the surface of the planarized first metallization layer Ml, while the dielectric 7 and the second conductive layer 8 are patterned to form a stack of these two layers covering at least a portion of the bottom plate 4. After that, a second patterning step is performed to pattern the first conductive layer 6 and possibly the second conductive layer 8 simultaneously. In this way, the first conductive layer can be used to form additional structures within the first metallization layer M1.

Figure 2E:
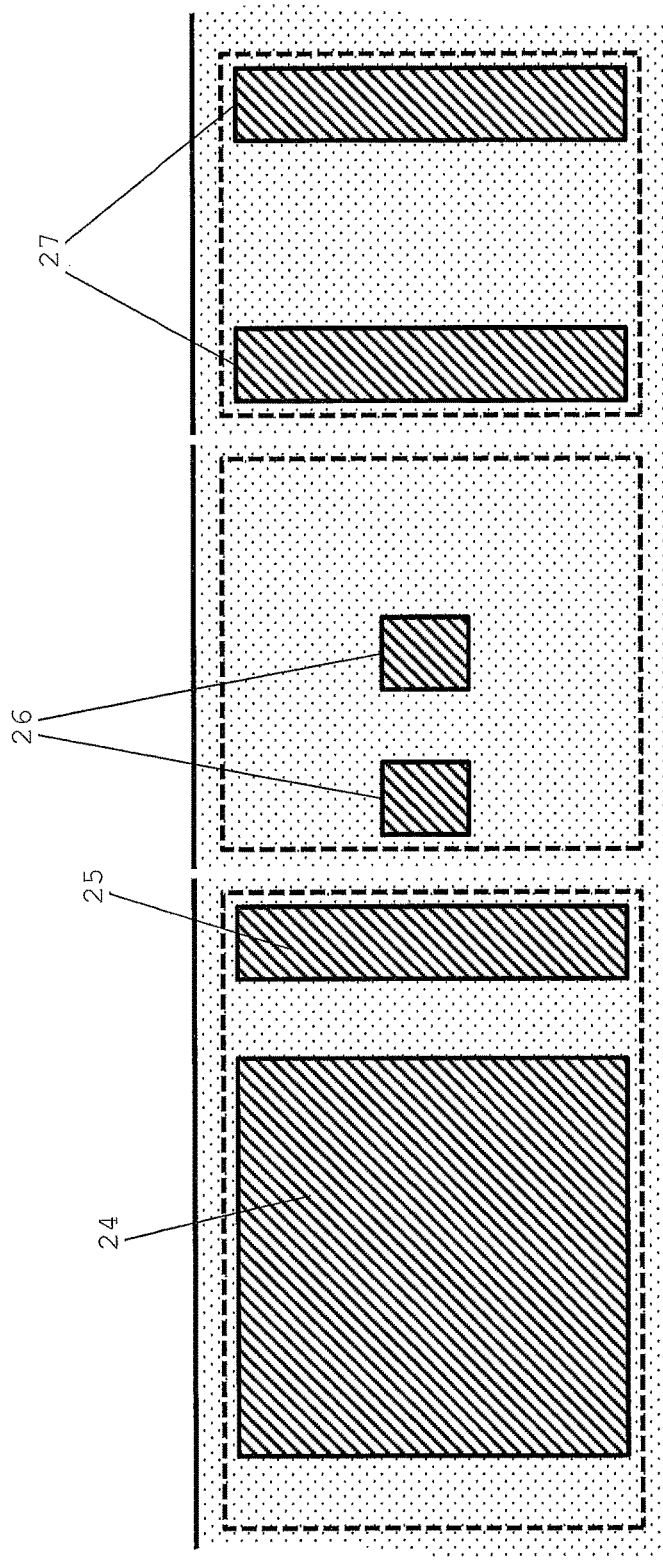

This embodiment is illustrated in FIGS. 2a-2e. FIG. 2a shows the stage where the stack of layers 6/7/8 described in relation to FIG. 1, has been deposited on the planarized first metallization layer M1. The structures 15 comprise a part of an inductor pattern in the first metallization layer M1, while the MIM-stack also extends over a portion 3' of the IMD 3 of M1, with no metal present in the portion. FIG. 2b shows the result of a first patterning step wherein only the dielectric layer 7 and the second conductive layer 8 are patterned to form a MIM-stack 9 which covers at least a portion of the bottom plate 4. The MIM-stack 9 comprises the remainder of the dielectric layer 7, the second conductive layer 8 and a portion of the first conductive layer 6, where the first conductive layer 6 remains intact on the surface of the first metallization layer M1. That is, etching of layers 7 and 8 stops on the first conductive layer 6, for example, by choosing an etchant having a suitable selectivity between etch rates of the first conductive layer 6 and the dielectric layer 7.

In a second patterning step, the first conductive layer 6 is patterned, as shown in FIG. 2c. Portions 20 and 21 of the layer 6 to the left and right of the MIM stack remain. Furthermore, a portion 22 above the inductor structure 15 and covering the entire inductor structure remains as well. Finally, a rectangular portion 23 remains on the portion 10' of the IMD. These portions 20 to 23 of the first conductive layer 6 can now serve as additional structural elements in the metallization layout. Deposition and patterning of the second metallization layer M2 results in the view of FIG. 2d, once again with the top copper plate 24 on and in contact with the second conductive layer 8 of the MIM-stack. A via 25 is produced for contacting the first conductive layer 6 and thus the bottom plate 4 from the second metallization layer M2. Vias 26 are provided for contacting the inductor 15, while rectangular vias 27, as seen in the top view of FIG. 2e, are produced for connecting the rectangular portion 23 of the first conductive layer to the second metallization layer M2. In this way, the rectangular portion 23 may be integrated as a resistor in the circuit defined within the second metallization layer M2.

The function of the inductor shaped portion 22 of layer 6 and of the portion 21 to the right of the MIMCAP (contacted by via 25) is to provide a possible advantage in the processing of the M1 and M2 layers. When etching the vias 25 and 26 for example, the etching stops on the first conductive layer 6 (e.g. a TaN layer), and not on the Cu. Stopping on a Cu layer can lead to contamination of the etching chamber, which complicates the process. The presence of the first conductive layer 6 makes it possible to avoid those complications (by patterning the portion 22) at least during processing of the M1 and M2 layers, which is particularly advantageous given the high copper density of the layers M1 and M2. So even though the invention is not limited (as seen in FIG. 1 for example) to the embodiment wherein portions of the first conductive layer 6 remain on inductors and/or other structures in the M1 layer, the invention does represent a considerable advantage in providing this possibility.

In some embodiments, the patterned portion 22 of layer 6 can also serve as at least a part of an inductor (i.e. without the inductor pattern 15 in the M1 layer). In some embodiments, the patterned layer 22 can serve as a stand-alone inductor without the inductor pattern 14, in circumstances where the thickness of the inductor pattern 22 is sufficient for serving as a workable inductor. In general, the patterned portions of the first conductive layer 6 may serve as contact portions for structures (such as inductor 15) in one of the metallization layers M1/M2 or the portions may themselves play the part of circuit elements in the metallization layers (such as the resistor 23, or theoretically, the inductor pattern 22).

Figures 3A, 3B, 3C:
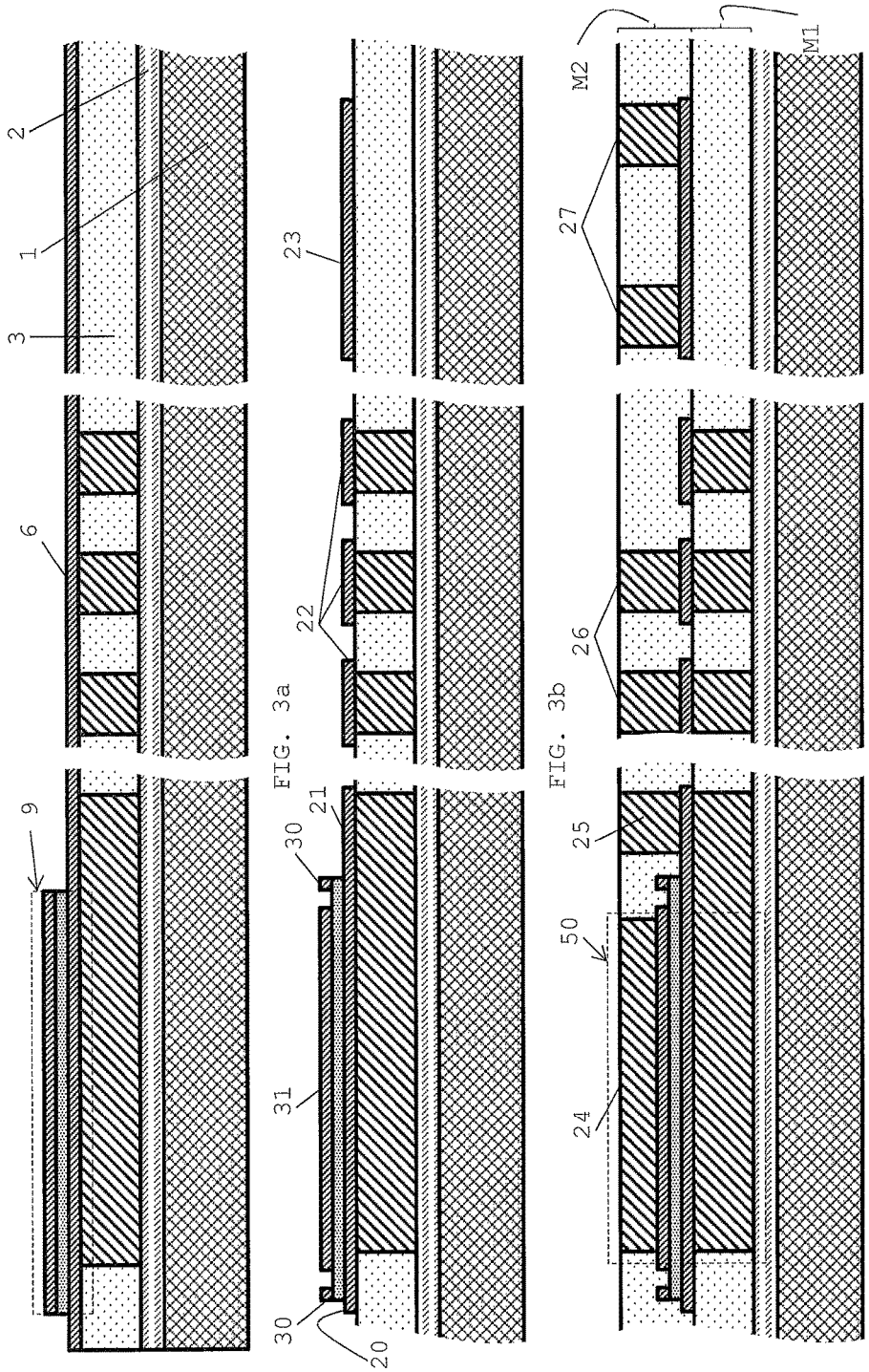
FIGS. 3a to 3c illustrate a method of fabricating a MIMCAP according to another embodiment.

In a still further embodiment, the patterning process for patterning the first conductive layer 6 serves also to pattern portions of the second conductive layer 8 that forms the top layer of the MIM stack 9. According to an embodiment illustrated in FIGS. 3a-3c, this patterning is to the effect that a ring structure 30 (not necessarily circular-shaped) is formed surrounding a central portion 31 of the top conductive layer 8, in the plane of the MIMCAP. The top copper plate 24 then only contacts the central portion 31. The ring portion 30 serves to prevent possible shorting between the top and bottom electrodes at the edge of the capacitor. The structure of the MIMCAP of the invention, and its fabrication method allows formation of such a protective ring 30 simultaneously with the patterning of the first conductive layer 6, and thus provides an economic way of producing complex structures.

Figure 4A:
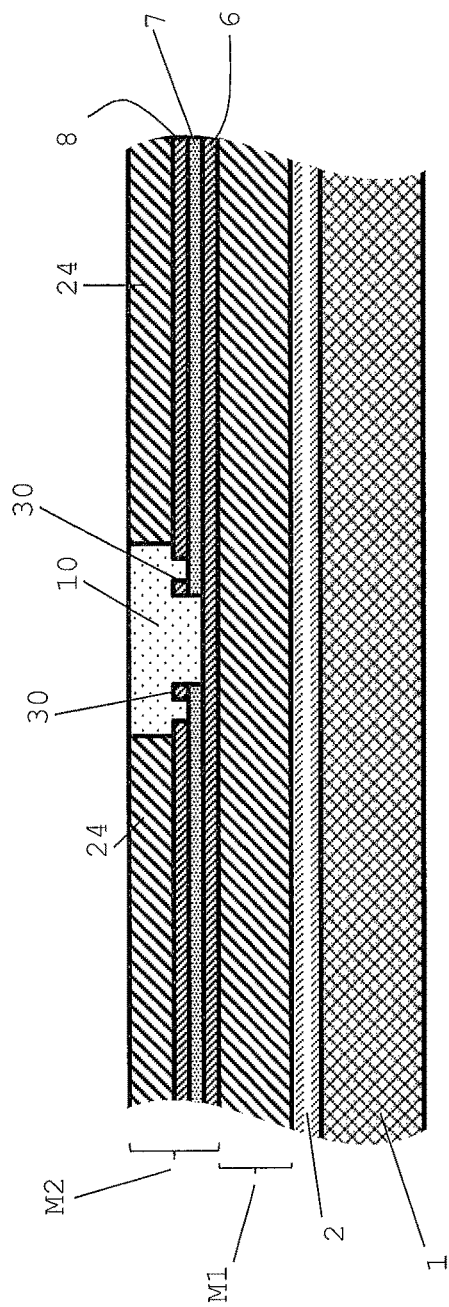
FIGS. 4a and 4b illustrate a device structure according to one embodiment.
Figure 4B:
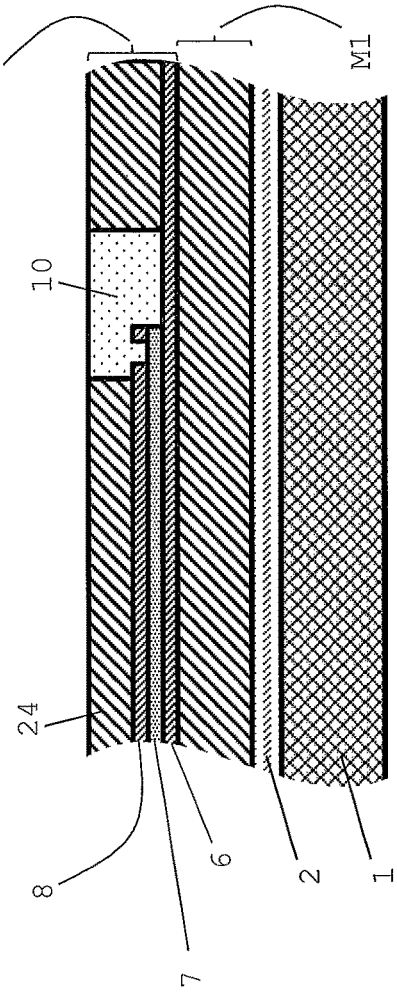

According to another embodiment, the first conductive layer 6 remains intact after a first patterning process, as in the embodiments of FIGS. 2 and 3, however, unlike in the embodiments of FIGS. 2 and 3, but in the second patterning process, it is only the second conductive layer 8 which is further patterned, for example to form a ring structure 30, while the first conductive layer 6 still remains intact. Example structures fabricated by this embodiment is illustrated in FIGS. 4a and 4b. In these embodiments, there is no separate process of processing a separate bottom plate having dimensions that are in the same order of magnitude as the top plate 13 or 24. The bottom plate of the MIMCAP is a portion of a larger metal layer in the M1-layer.

According to an embodiment, the process of patterning the dielectric layer 7 and the second conductive layer 8 of the MIM-stack, with the first conductive layer 6 remaining intact, does not only take place at the location of the eventual MIMCAP above the bottom plate 4, but similar stacks of portions 7' and 8' formed by patterning the layers 7 and 8 may also remain on other locations. In embodiments illustrated in FIGS. 5a and 5b, additional stacks 40 including the portions 7' and 8' are produced on the resistor portion 23. In some embodiments, the stacks 40 protect a large portion of the resistor metal during the etching of the dielectric 7 in other areas. This therefore allows a better control of the resistance value of the resistor. The stack 40 may be further provided with a connection 28 to the next metallization layer (FIG. 5b).

In some embodiments, the IMD material may be formed of silicon oxide ($SiO_2$), a combination of $SiO_2$ with silicon nitride ($Si_3N_4$) or a combination of $SiO_2$ and silicon carbide (SiC). In other embodiments, the IMD may be formed of a low-k material. In some embodiments, the metal material of the metallization comprises copper. In some embodiments, the M1 and M2 layers may have thicknesses according to known practice in the domain of damascene processing, e.g. around 1 micron. In some embodiments, the thickness of the M2 layer may be chosen higher than M1 given that the CMP process will generally take longer as the topography caused by the MIM-stack patterning needs to be removed.

In some embodiments, the first and second conductive layer 6/8 of the MIM-stack may be formed of, for example, Ta, TaN, Ti, TiN, or other suitable conductive materials. The layers 6, 7 and 8 preferably have the same thickness, e.g. between about 50 nm and about 100 nm. At least the thickness of the first and second conductive layer 6 and 8 is preferably the same, especially in the embodiment of FIG. 2, where both layers are etched in the same etching process.

In some embodiments, the dielectric layer 7 of the MIM-stack may be formed of, for example, silicon oxide (e.g., $SiO_2$), silicon nitride (e.g., $Si_3N_4$), silicon carbide (e.g., SiC), tantalum oxide (e.g., $Ta_2O_5$), hafnium oxide (e.g., $HfO_2$), titanium oxide (e.g., $TiO_2$), an ONO-stack (Oxide-nitride-oxide), or any other suitable dielectric material.

According to an embodiment, an annealing process can be performed prior to performing a CMP process on the first metallization layer M1. In one embodiment, the annealing temperature is between about 350° C. and about 450° C. The annealing is done to decrease hillocks formation due to stress induced by the subsequent processes (MIM-stack deposition).

Figure 6:
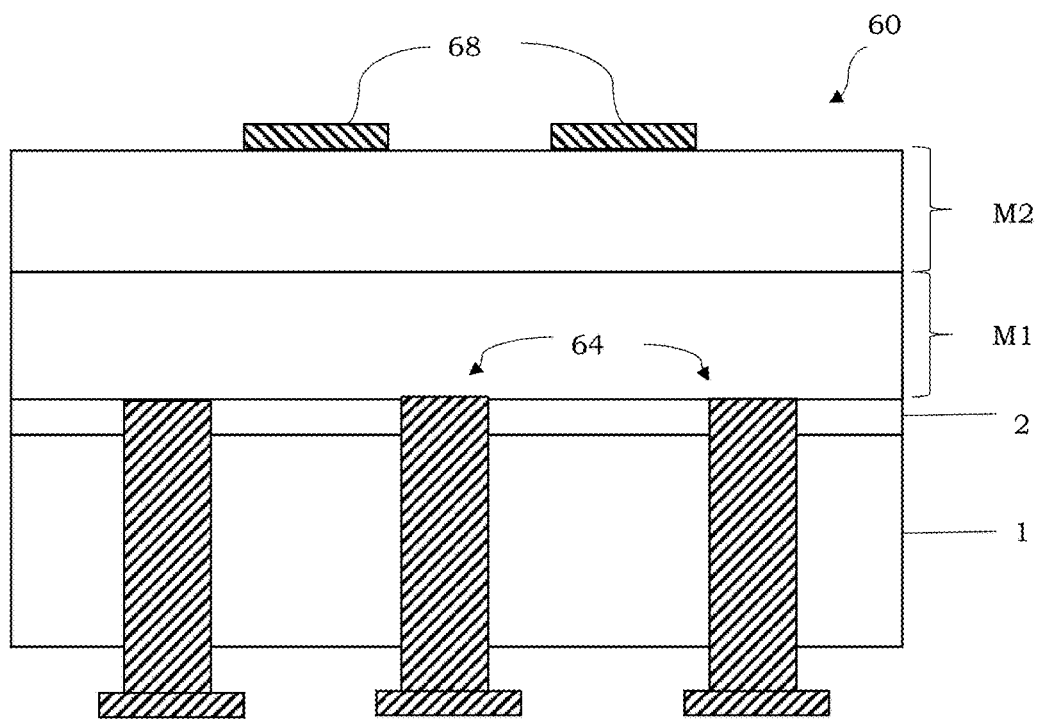
FIG. 6 illustrates an interposer substrate comprising a MIMCAP, according to embodiments.

The embodiments disclosed herein can be integrated with existing BEOL process schemes. According to an embodiment, for example, various embodiments of the MIMCAP structures described above can be integrated with an interposer substrate, in particular between the power supply layer the ground layer of such an interposer. This is particularly advantageous due to the large surface that is available for the MIMCAP. FIG. 6 illustrates an interposer substrate 60 having a MIMCAP integrated therein, according to embodiments. The interposer substrate 60 can have one or more electrical connection points, such as through-substrate vias 64 at one side and contact pads 68 at another side, for connecting circuits outside of the interposer substrate 60 through one or more metallization layers (e.g., M1 or M2) of the interposer substrate 60.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or processes, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

Unless specifically specified, the description of a layer being formed, deposited or produced 'on' another layer or substrate, includes:
  the layer being formed, deposited or produced, or formed, deposited or deposited directly on, i.e. in contact with, the other layer/layers and/or the substrate, and
  the layer being formed, deposited or produced on one or a stack of intermediate layers between the layer and the other layer and/or the substrate.

What is claimed is:

1. An interposer substrate configured to electrically connect to one or more semiconductor devices in a semiconductor device package, the interposer substrate comprising:
   a plurality of interconnected metallization layers including a lower metallization layer and an upper metallization layer that are vertically adjacent metallization layers, at least portions of the upper and lower metallization layers forming parts of a metal-insulator-metal capacitor (MIMCAP), wherein the MIMCAP comprises:
      a conductive bottom plate which forms a first lateral part of the lower metallization layer,
      a first conductive layer, at least a portion of which is formed on the conductive bottom plate,
      a dielectric layer on and in contact with the first conductive layer,
      a second conductive layer on and in contact with the dielectric layer,
      wherein the first conductive layer comprises an extension portion laterally extending beyond an area covered by the dielectric layer and the second conductive layer, and
      a conductive top plate which forms a first lateral part of the upper metallization layer, the conductive top plate formed on the second conductive layer and extending vertically from the second conductive layer to a top surface level of the upper metallization layer; and
   wherein the interposer substrate further comprises a conductive via which forms a second lateral part of the upper metallization layer and laterally separated from the first lateral part of the upper metallization layer, the conductive via extending vertically from the extension portion of the first conductive layer to the top surface level of the upper metallization layer.

2. The interposer substrate of claim 1, wherein the second conductive layer is surrounded by a ring structure coplanar with the second conductive layer.

3. The interposer substrate of claim 2, wherein the conductive top plate contacts the second conductive layer without contacting the coplanar ring structure.

4. The interposer substrate of claim 1, wherein the conductive bottom plate directly contacts the first conductive layer.

5. The interposer substrate of claim 1, wherein the conductive top plate directly contacts the second conductive layer.

6. The interposer substrate of claim 1, wherein the MIMCAP is formed at a first area of the interposer substrate, the interposer substrate further comprising a second area having formed therein an inductor structure comprising a patterned conductive structure which forms a second lateral part of the lower metallization layer.

7. The interposer substrate of claim 6, wherein the inductor structure further comprises a patterned conductive layer that is coplanar with and formed of the same material as the first conductive layer, the patterned conductive layer being in contact with the patterned conductive structure.

8. The interposer substrate of claim 7, further comprising a second via vertically extending to electrically contact the patterned conductive layer, the second via forming a third lateral part of the upper metallization layer.

9. A method of fabricating an interposer substrate configured to electrically connect to one or more semiconductor devices in a semiconductor device package, the method comprising:
   forming a plurality of interconnected metallization layers including a lower metallization layer and an upper metallization layer that are vertically adjacent metallization layers, at least portions of the upper and lower metallization layers forming parts of a metal-insulator-metal capacitor (MIMCAP),
   wherein forming the metal-insulator-metal capacitor (MIMCAP) comprises:
      patterning to form a conductive bottom plate which forms a first lateral part of the lower metallization layer,
      forming a first conductive layer, at least a portion of which is formed on the bottom plate,
      forming a dielectric layer on and in contact with the first conductive layer,
      forming a second conductive layer on and in contact with the dielectric layer,
      wherein forming the first conductive layer comprises forming a portion laterally extending beyond an area covered by the dielectric layer and the second conductive layer, and
      patterning to form a conductive top plate which forms a first lateral part of the upper metallization layer, the conductive top plate formed on the second conductive layer and extending vertically from the second conductive layer to a top surface level of the upper metallization layer; and
   wherein the method of fabricating the interposer substrate further comprises forming a conductive via which forms a second lateral part of the upper metallization layer and laterally separated from the first lateral part of the upper metallization layer, the conductive via extending vertically from the extension portion of the first conductive layer to the top surface level of the upper metallization layer.

10. The method of claim 9, further comprising surrounding the second conductive layer with a ring structure coplanar with the second conductive layer.

11. The method of claim 10, wherein the second conductive layer and the coplanar ring structure are patterned simultaneously.

12. The method of claim 11, wherein forming the portion of the first conductive layer comprises selectively etching a portion of the dielectric layer and a portion of the second conductive layer and stopping to expose the portion of the first conductive layer.

13. The method of claim 12, wherein forming the upper metallization layer and forming the lower metallization layer comprise patterning by a copper damascene process.

14. The method of claim 13, wherein patterning by the damascene process comprises forming a dielectric layer over the portion of the first conductive layer, etching a portion of the dielectric layer and stopping on the portion of the first conductive layer, such that the conductive bottom plate is not exposed during etching the portion of the dielectric layer.

15. The method of claim 9, wherein the MIMCAP is formed at a first area of the interposer substrate, the method further comprising forming in a second area an inductor structure comprising a patterned conductive structure which forms another part of the lower metallization layer.

* * * * *